United States Patent
Bowman et al.

(10) Patent No.: US 8,623,145 B2
(45) Date of Patent: Jan. 7, 2014

(54) SUBSTRATE PROCESSING APPARATUS WITH COMPOSITE SEAL

(75) Inventors: Don Bowman, Bonita, CA (US); Stephen Coppola, Boston, MA (US); Kenneth W. Cornett, Ivoryton, CT (US); Dan Funke, San Diego, CA (US); Julian Kamibayashiyama, San Diego, CA (US); Jeff Navarro, Chula Vista, CA (US); Jeremy M. Payne, New Haven, CT (US); Donald J. Peterson, Chula Vista, CA (US); Douglas C. Schenk, Chula Vista, CA (US)

(73) Assignee: Parker-Hannifin Corporation, Cleveland, OH (US)

( * ) Notice: Subject to any disclaimer, the term of this patent is extended or adjusted under 35 U.S.C. 154(b) by 906 days.

(21) Appl. No.: 12/731,223

(22) Filed: Mar. 25, 2010

(65) Prior Publication Data
US 2011/0232843 A1   Sep. 29, 2011

(51) Int. Cl.
| | | |
|---|---|---|
| C23C 16/00 | (2006.01) | |
| F16J 15/14 | (2006.01) | |
| F16J 15/00 | (2006.01) | |
| F16J 15/02 | (2006.01) | |
| F16J 15/06 | (2006.01) | |
| F16J 15/10 | (2006.01) | |

(52) U.S. Cl.
USPC ........... 118/733; 277/590; 277/628; 277/641; 277/644; 277/647; 277/650; 277/652; 277/944; 277/945; 277/946

(58) Field of Classification Search
USPC ......... 277/589, 628, 641, 642, 644, 647, 650, 277/652, 944–946, 590; 118/733
See application file for complete search history.

(56) References Cited

U.S. PATENT DOCUMENTS

| | | |
|---|---|---|
| 4,831,212 A | 5/1989 | Ogata et al. |
| 5,805,408 A | 9/1998 | Maraschin et al. |
| 6,073,576 A | 6/2000 | Moslehi et al. |
| 6,089,543 A | 7/2000 | Freerks |
| 6,286,839 B1 | 9/2001 | Mitsui et al. |
| 6,413,800 B1 | 7/2002 | Kyle |
| 6,475,336 B1 | 11/2002 | Hubacek |
| 6,764,386 B2 | 7/2004 | Uziel |
| 6,932,354 B2 | 8/2005 | Kane et al. |
| 2003/0134574 A1 | 7/2003 | Uziel |
| 2005/0263878 A1 | 12/2005 | Potter |
| 2007/0075503 A1 | 4/2007 | Hayashi et al. |
| 2008/0018058 A1 | 1/2008 | Kobayashi et al. |
| 2009/0174152 A1 | 7/2009 | Muramatsu |
| 2011/0232843 A1* | 9/2011 | Bowman et al. ........... 156/345.1 |

FOREIGN PATENT DOCUMENTS

| | | |
|---|---|---|
| WO | 2007/094228 | 8/2007 |
| WO | 2009/038022 | 3/2009 |

* cited by examiner

*Primary Examiner* — Jeffrie R Lund
(74) *Attorney, Agent, or Firm* — Renner, Otto, Boisselle & Sklar, LLP

(57) ABSTRACT

A seal for sealing an interface between a container and a lid of a process chamber. The seal comprises a first seal element and a second seal element that are arranged to seal the interface in series, with the second seal element being situated to encounter processing activity upstream of the fist seal element. The first seal element has a deflectable portion and a protrusion extending radially from the deflectable portion. The second seal element has a radially extending recess in which the protrusion of the first seal element is received. The protrusion and recess interlock to restrict separation and/or rotation of the first and second seal elements. Inclined surfaces of the first seal element interact with the second seal element to apply axial sealing forces to sealing surfaces of the second seal member.

20 Claims, 6 Drawing Sheets

SUBSTRATE PROCESSING APPARATUS WITH COMPOSITE SEAL

FIELD OF INVENTION

The present invention relates generally to seals. More particularly, the invention relates to seals for use in a substrate processing apparatus.

BACKGROUND

A semiconductor process chamber commonly comprises a container, a lid, and a seal that seals an interface between the container and lid. The lid is usually movable between a position whereat it closes an access opening into the processing space, and a position whereat the access opening is uncovered for loading/unloading of the processing space. The container's interface surface and/or the lid's interface surface can include a circumferential groove in which the seal is situated.

Many semiconductor manufacturing methods now use processing chambers to create ultra-high-vacuum (UHV—pressures lower than about $10^{-7}$ pascal and/or $10^{-9}$ torr) and/or ultra-high-purity (UHP—total maximum contaminant level of 10 ppm) environments. These manufacturing methods can involve repeated opening and sealing process chambers so that substrates (e.g., wafers) can be continuously loaded, processed, and then unloaded therefrom. Slow production rates (e.g., caused by long pump-down times), significant equipment downtime (e.g., for seal replacement or interface cleaning) and/or substandard yields (e.g., due to particle generation) are generally viewed as undesirable by semiconductor manufacturers.

Exemplary seals that are known in the art for sealing such processing chambers are disclosed in the following patent documents: U.S. Pat. No. 6,286,839, US 2009/00174152, US 2008/0018058, US 2007/0075503, WO 2009/038022. Such seal designs generally include first and second sealing elements in the form of an elastomeric sealing element and a metallic or polymeric sealing element, respectively. The metallic or polymeric sealing element is typically situated to shield the elastomeric sealing element from plasma within the chamber that may otherwise degrade the elastomer. Many of these designs lack a provision for interlocking the first and second sealing elements together, or provide an interlock that is significantly spaced apart radially and/or axially from the sealing surfaces of the second sealing element. Further, many of the designs employ voids between the first and second seal elements.

SUMMARY

Contrary to prior art seals, the present invention provides a seal that operates to energize the sealing surfaces of its second sealing element in an entirely different manner. The seal employs an interlocking protrusion that is uniquely configured to energize the sealing surfaces of the second sealing element when the seal is subject to compression and represents an improvement over the prior art designs that generally do not provide efficient energizing of the second seal elements by the first seal element during compression. The seal thus comprises first and second interlocked seal elements that function in a substantially different way than prior art seals to achieve a superior sealing performance.

The seal includes a first seal element having a protrusion and second seal element having a recess in which the protrusion is received. The protrusion and recess interlock to restrict separation and/or rotation of the first and second seal elements, and to provide the mechanism that operates to energize the sealing surfaces in an entirely different manner than prior art seals to provide a significantly different effect. More specifically, the protrusion of the first seal element includes an inclined surface that is radially coextensive with a major portion of a sealing surface of the second seal element. When the seal is deflected, the inclined surface assists in urging the sealing surface of the second seal element into sealing engagement with a surface to be sealed. This is contrary to some prior art seals wherein the first seal element tends to rotate the sealing surface away from the surface to be sealed under compression.

The seal can be constructed to achieve ultra high vacuum levels without compromising on cleanliness, and still allow a clamped (rather than bolted) container-lid interface. Thus, the seal can efficiently be used in UHV and/or UHP processing chambers with unbolted and/or dynamic interfaces.

An elastomeric first seal element and a polymeric second seal element can be arranged and adapted to seal the chamber's interface sequentially during its conversion to a sealed condition. The elastomeric seal element creates a seal during early evacuation stages, with the help of a clamping device. This maintains the chamber's vacuum, so that the pressure differential can continue to rise, and provide the sealing load necessary for the polymeric seal element to create a seal.

The polymeric seal element can be positioned upstream of the elastomeric seal element relative to the processing chamber. (In cylindrical processing chambers, for example, the polymeric seal element can be positioned radially inward of the elastomeric seal element.) In this manner, the polymeric seal element shields the elastomeric seal element from gas permeation, thermal exposure, and reactive plasmas, and/or ion-impingement. The polymeric seal element can also shield the processing chamber from particles generated by the elastomeric seal element. In this manner, the disadvantages often associated with elastomeric seals (e.g., gas-permeation bulk, reactive degrade, thermal-exposure deterioration, shortened life span, impure-particle generation, electrical-discontinuity causation, etc.) are eliminated or at least minimized.

According to an aspect of the invention, a seal for sealing an interface between a container and a lid of a process chamber comprises a first seal element having a deflectable portion and a protrusion extending radially inwardly from the deflectable portion, and a second seal element having at least one sealing surface and a radially outwardly extending recess in which the protrusion of the first seal element is received, a radially inner surface of the protrusion abutting a radially inner surface of the recess. The protrusion and recess interlock to restrict separation of the first and second seal elements, and the protrusion has an inclined surface that is radially coextensive with a major portion of the sealing surface and extends to a maximum axial extent of the protrusion.

The second seal element can have an abutment surface abutting the inclined surface of the protrusion whereby during compression of the seal, when a force is applied to the second sealing element tending to separate it from the first seal element, a reaction force is generated at the inclined surface that tends to apply an axial sealing force to the at least one sealing surface of the second sealing element. The inclined surface can extend to the radially outer extent of the protrusion. The sealing surface and the abutment surface of the second seal element can slope away from each other in the radially outward direction thereby forming a wedging portion of the second seal element for applying an axial sealing force to the sealing surface during compression of the first seal element.

The at least one sealing surface can be configured to pivot about a point located radially inwardly and outside of the second seal member when the seal is deflected.

The recess and/or protrusion have an anti-rotatable fit to restrict rotation of the first seal element relative to the second seal element. The second seal member can further comprise upper and lower arms extending radially from a central axially extending body, the arms and body defining therebetween the recess and being adapted to engage opposing sides of the protrusion. The recess can be a dovetail-shape in cross-section. The second seal element can be supported by the first seal element, and the first seal element and second seal element can be adapted to seal in series. The first seal element can extend above and below the height of the second seal element an approximately equal distance when in an undeflected state. The first and second seal elements can also be generally symmetrical about a common central radial axis.

The second seal element can have radially outwardly opening compression grooves spaced axially above and below the recess, the grooves defining upper and lower lip portions of the second sealing element adapted to seal against respective surfaces. The first seal element can be composed of an elastomeric material, while the second seal element can be composed of a polymeric material such as PEEK or PTFE or the like. The first seal element and second seal element can be bonded together.

According to another aspect, a process chamber comprises a container defining a processing space and an access opening into the processing space, a lid convertible between a sealed condition whereat it seals the access opening into the processing space, and a loading/unloading condition whereat the access opening is uncovered for insertion/withdrawal of a substrate, and a seal as set forth above for sealing an interface between the container and the lid.

According to another aspect, a seal for sealing an interface between a container and a lid of a process chamber comprises a first seal element having a deflectable portion and a protrusion extending radially from the deflectable portion, and a second seal element having at least one sealing surface and a radially extending recess in which the protrusion of the first seal element is received. The protrusion and recess interlock to restrict separation of the first and second seal elements, and the protrusion has an inclined surface that is radially coextensive with a major portion of the sealing surface and extends to a maximum axial extent of the protrusion, such maximum axial extent being generally radially aligned with a midpoint of the sealing surface.

According to yet another aspect, a seal for sealing an interface between a container and a lid of a process chamber comprises a first seal element having a deflectable portion and a protrusion extending radially from the deflectable portion, and a second seal element having at least one sealing surface and a radially extending recess in which the protrusion of the first seal element is received. The protrusion and recess interlock to restrict separation of the first and second seal elements, and the protrusion has an inclined surface that is radially coextensive with a major portion of the sealing surface and extends to a maximum axial extent of the protrusion. The first and second seal elements are generally symmetrical about a common central radial axis.

DRAWINGS

DESCRIPTION

Figure 1:
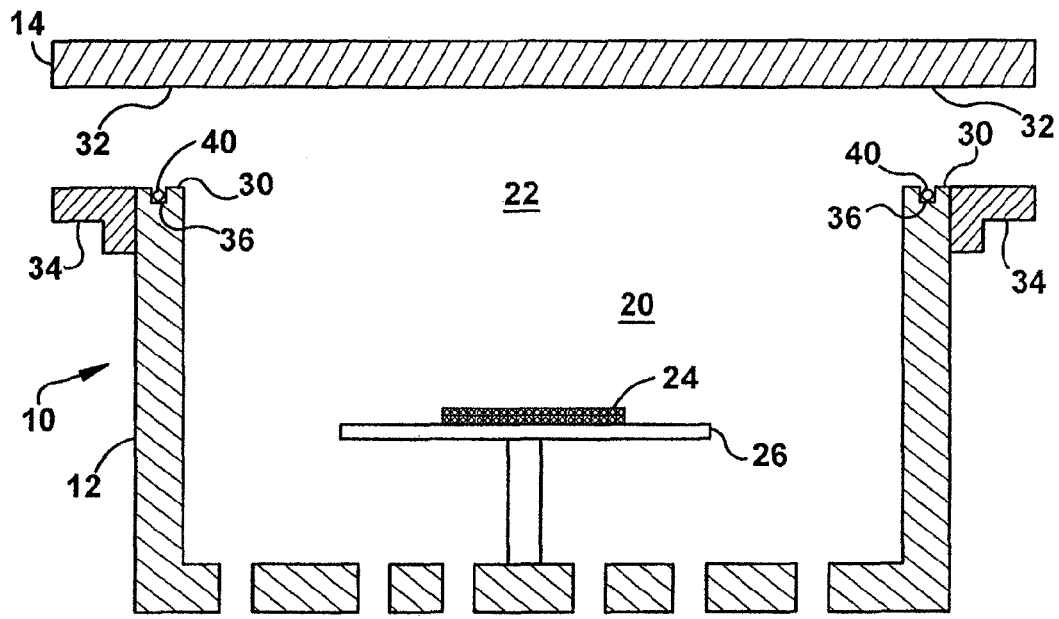
FIG. 1 is a schematic view of a process chamber comprising a container and a lid, the lid being shown in its load/unload position.
Figure 2:
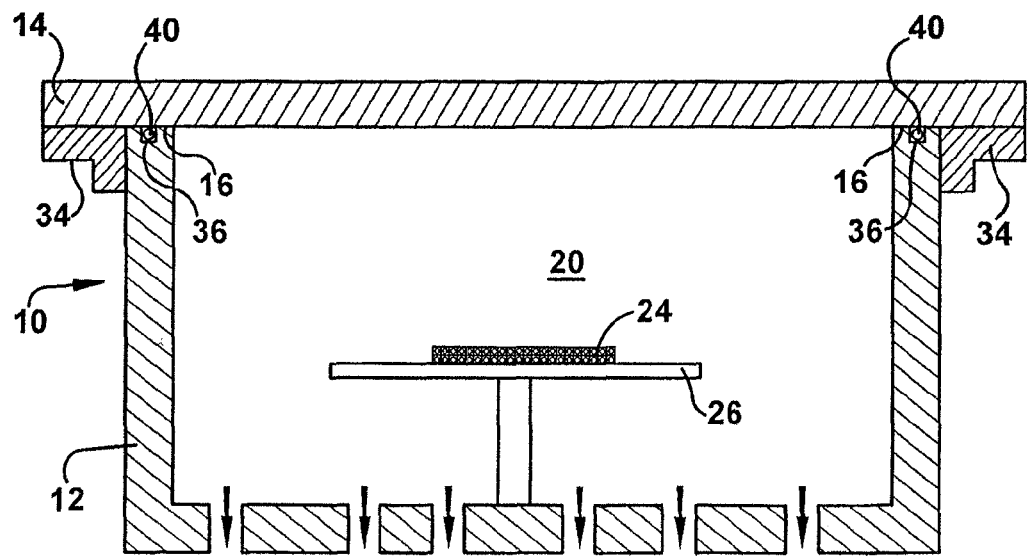
FIG. 2 is a schematic view of the process chamber of FIG. 1, the lid being shown in its sealed position.

Referring now to the drawings, and initially to FIGS. 1 and 2, a process chamber 10 comprises a container 12, a lid 14, and an interface 16 therebetween. The container 12 defines a processing space 20 (and an access opening 22 thereinto). The lid 14 is movable between a closed or sealed position (FIG. 1), whereat it seals the access opening 22 into the processing space 20, and a loading/unloading position (FIG. 2), whereat the access opening 22 is uncovered.

The process chamber 10 can be an ultra-high-vacuum (UHV) and/or ultra-high-purity (UHP) chamber which is part of a semiconductor manufacturing process. When the lid 14 is in its load-unload position, the substrate 24 (e.g., a wafer) can be inserted through the access opening 22 into the processing space 20 and staged on the pedestal 26. Once the lid 14 is moved to its closed position, the interface 16 is sealed, the substrate 24 can be processed within the container 12. The processing can comprise photo-masking, deposition, oxidation, nitridation, ion implantation, diffusion, and/or etching, for example. After the wafer-processing step, the vacuum can be released within the processing space 20, and the lid 14 can be moved from its closed position to its load-unload position. The substrate 24 can be withdrawn from the processing space 20 (through the access opening 22) and the steps repeated for the next substrate (e.g., the next wafer in the processing line).

The container 12 includes an interface surface 30 surrounding the access opening 22 and the lid 14 includes an interface surface 32 seated against the container's interface surface 30 when in its sealed position. These surfaces 30/32 together define the interface 16 between the container 12 and the lid 14. A clamp 34 (or other suitable means) can be provided to brace, lock, or otherwise hold the lid 14 against the container 12.

The container's interface surface 30 and/or the lid's interface surface 32 includes at least one groove 36. In FIGS. 1 and 2, the groove 36 has a rectangular cross-sectional shape. But, the groove 36 can have a trapezoidal or dove-tail cross-section shape (e.g., FIGS. 3 and 4), or any other suitable cross-section shape. The groove 36 is continuous around the rim (e.g, perimeter, circumference) surrounding the processing chamber 20 and/or the access opening 22.

Figure 3:
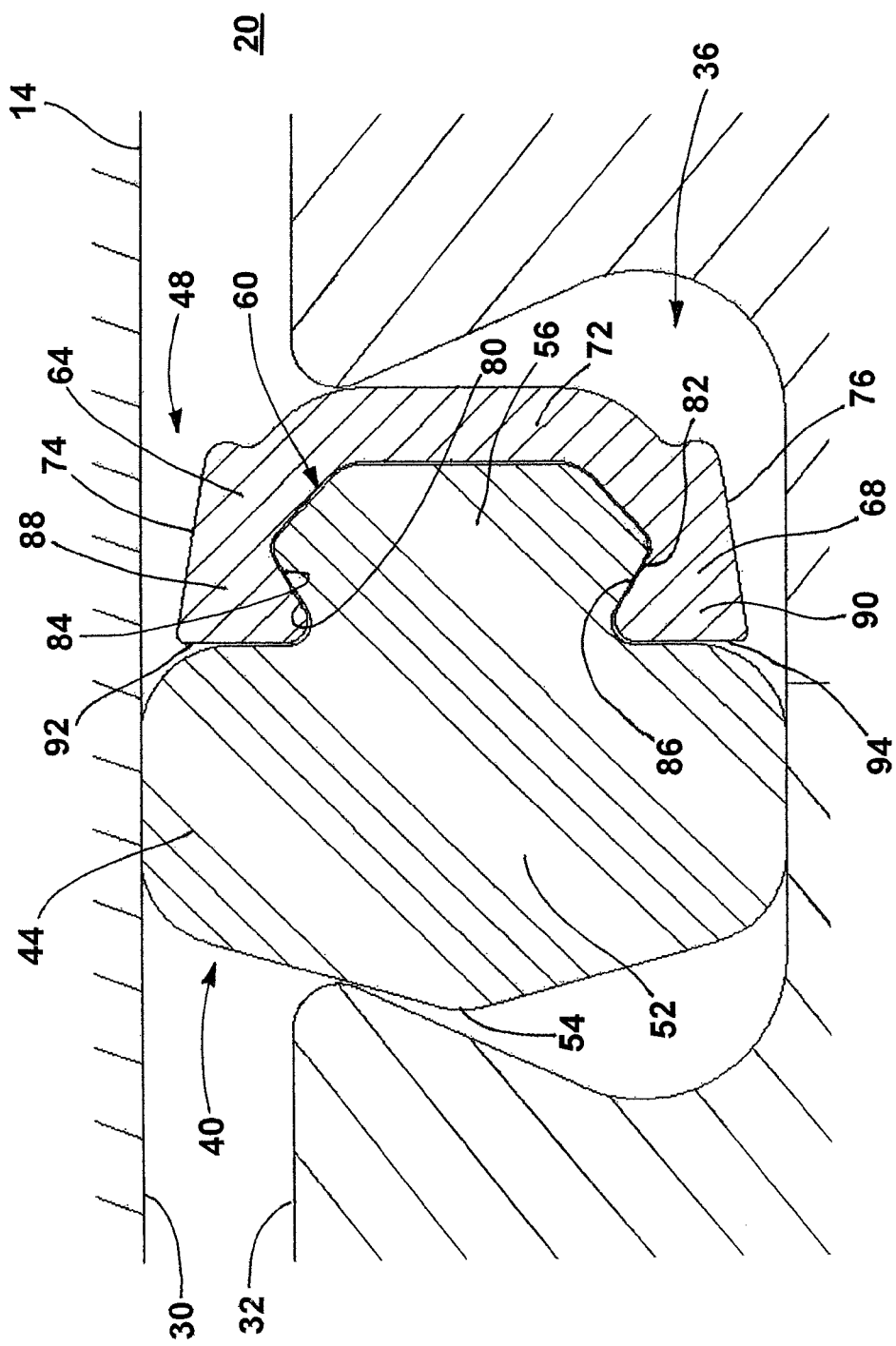
FIG. 3 is a close-up view showing an exemplary seal in accordance with the invention installed in a groove in an interface surface of the container when the lid is in its load/unload position.
Figure 4:
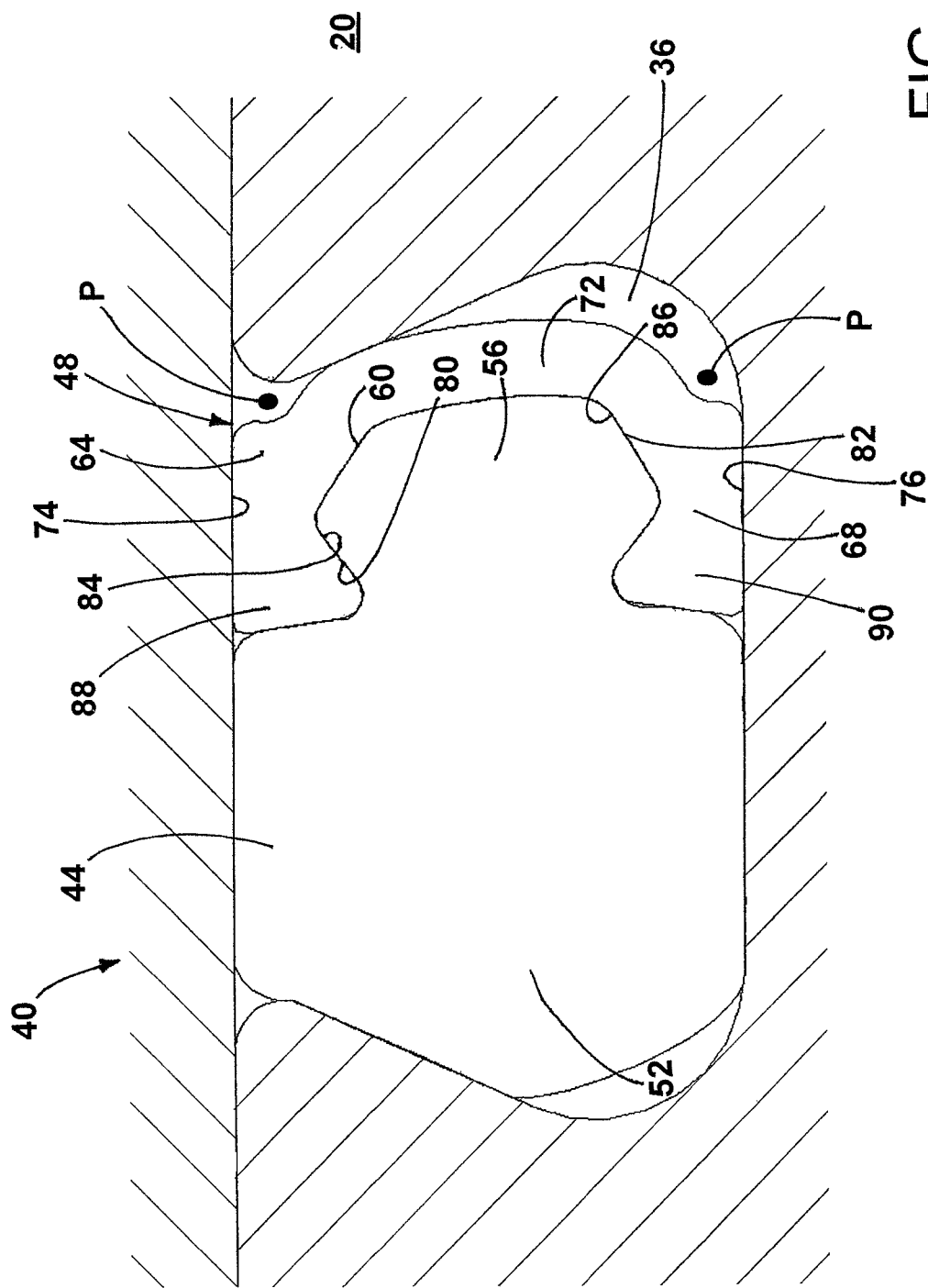
FIG. 4 is a close-up view similar to FIG. 3, except that the lid is shown in its sealed position.

Turning to FIGS. 3 and 4, an exemplary seal 40 is situated in groove 36, which in this embodiment has a dovetail shape cross-section. The seal 40 has a generally ring-like shape, so as to be seated in the continuous groove 36. As will be appreciated, the seal 40 is shown in an undeflected state in FIG. 3, and in a deflected state in FIG. 4.

The seal 40 generally comprises a first seal element, in the form of an elastomeric seal element 44, and a second seal element, in the form of a polymeric seal element 48. The elastomeric seal element 44 has a deflectable portion 52 adapted to be deflected directly by the lid 14, as best seen in FIG. 4. The radially outer surface of the elastomeric seal element 44 includes an axially central ridge 54 for retaining the seal 40 in the groove 36. The ridge 54 can also be designed or shaped to complement the shape of the groove 36 so as to engage a sidewall of the groove 36 when the seal is deflected to thereby crowd the radially outer free space of the groove to provide better energizing of the polymeric seal element 48. A protrusion 56 extends radially from the deflectable portion 52 of the elastomeric seal 44 and is received in a recess 60 of the polymeric seal 48.

The polymeric seal element 48 includes an upper arm 64 and a lower arm 68 extending radially from a central body 72. The upper and lower arms 64 and 68 each have respective sealing surfaces 74 and 76. The upper and lower arms 64 and 68 and central axially extending body 72 together generally define the recess 60 in which the protrusion 56 of the elastomeric seal element 44 is received.

As will be appreciated, the protrusion 56 may have a shape and/or size corresponding to the shape of the recess 60 prior to insertion therein, or may be deflected such that it conforms to the shape of the recess 60 when inserted therein. Compression of the protrusion 56 within the recess 60 can result in a preload being applied to the upper and/or lower arms 64 and 68 to achieve a desired sealing load. In the illustrated embodiment, the protrusion 56 completely fills the void space of the recess 60. Moreover, the protrusion 56 and recess 60 interlock to restrict separation of the elastomeric seal element 44 and the polymeric seal element 48. This interlock is created due to the axial extent of the opening of the recess 60 being smaller than the axial extent of the protrusion 56 at a point radially inward of the opening of the recess 60. The interlocking fit between the elastomeric seal element 44 and the polymeric seal element 48 can also rotationally interlock the parts to restrict rotation of the elastomeric seal element 44 relative to the polymeric part 48 to prevent rotation of the seal 40 in the groove 36 during seal compression.

The protrusion 56 has upper and lower inclined surfaces 80 and 82 that are generally radially coextensive with a major portion of the sealing surfaces 74 and 76, respectively. The recess 60 has abutment surfaces 84 and 86 abutting the inclined surfaces 80 and 82 of the protrusion 56. In the illustrated embodiment, the upper and lower inclined surfaces 74 and 76 generally extend from a maximum axial extent of the protrusion 56, that is generally radially aligned with a midpoint of the sealing surfaces 74 and 76, to a radially outer extent of the protrusion 56. Sealing surfaces 74 and 76 and respective abutment surfaces 84 and 86 generally slope away from each other in the radially outward direction thereby forming wedging portions 88 and 90 of the second seal element 48 which, along with inclined surfaces 80 and 82, assist in applying an axial sealing force to the sealing surfaces 74 and 76 upon compression of the first seal element 44.

Turning to FIG. 4, when the lid 14 is converted to the sealed condition whereat it seals the access opening 22 into the processing space 20, the seal 40 is deflected as shown. As will be appreciated, during conversion to the sealed condition the lid 14 contacts the elastomeric seal element 44 prior to the polymeric seal element 48. As the elastomeric seal element 44 is deflected, the lid 14 eventually contacts the sealing surface 74 on the upper arm 68 and compresses the polymeric seal element 48. The sealing surface 76 on the lower arm seals against the bottom of the groove 36. The size (e.g., the radial extent) of the sealing surfaces can be altered to alter the sealing load.

As will be appreciated, when the seal 40 is deflected by the lid 14, the upper and lower arms 64 and 68 act on the protrusion 56 of the elastomeric seal element 44. A reactionary force is therefore applied by the protrusion 56 to energize the upper and lower arms 64 and 68 to thereby maintain a tight seal at sealing surfaces 74 and 76. As the deflectable portion of the elastomeric seal 44 is deflected axially into the groove 36 by the lid 14, it tends to expand radially and apply a force in the radially inward direction to the radially outer surfaces 92 and 94 of the wedge portions 88 and 90. This force is at least in part reacted by the inclined surfaces 80 and 82 of the protrusion 56.

As a result, the wedging portion 88 is forced upward and the wedging portion 90 is forced downward thereby applying, respectively, axial sealing forces to sealing surfaces 74 and 76. This interaction between the elastomer seal element 44 and polymer seal element 48 is opposite to the function of seals in the prior art where radial forces applied to the second seal element by the first seal element tend to rotate the sealing surfaces away from the surfaces to be sealed.

As will also now be understood, during compression of the seal 40 the upper and lower arms 64 and 68 pivot of the polymeric seal element 48 about pivots points P that are located outside of the body of the polymeric seal element 48. Unlike conventional sealing elements that pivot about a point within their bodies, the sealing element 48 provides a sealing surface with a larger radial extent for a given seal element size.

Figure 5:
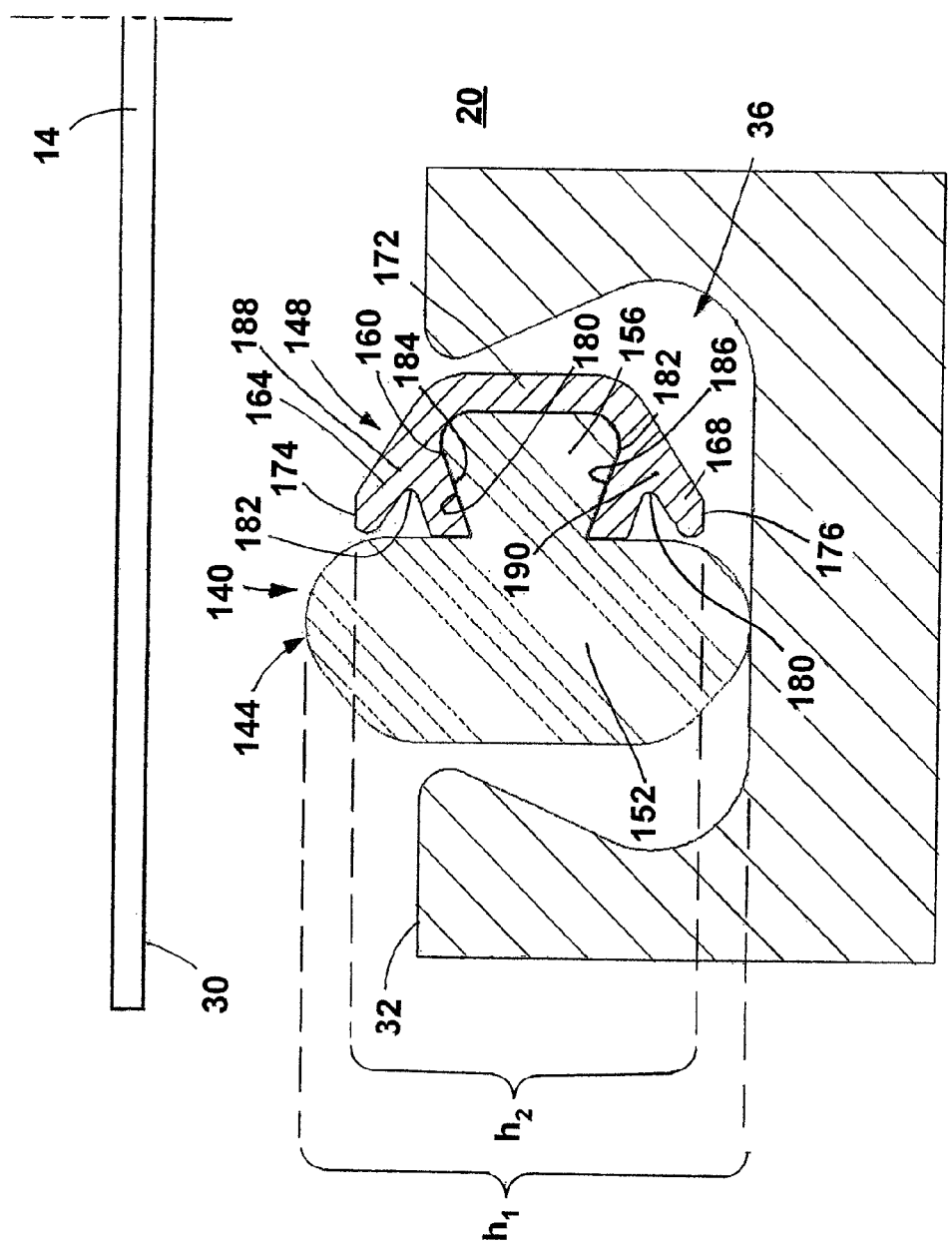
FIG. 5 is another exemplary seal in accordance with the invention in an undeflected state.
Figure 6:
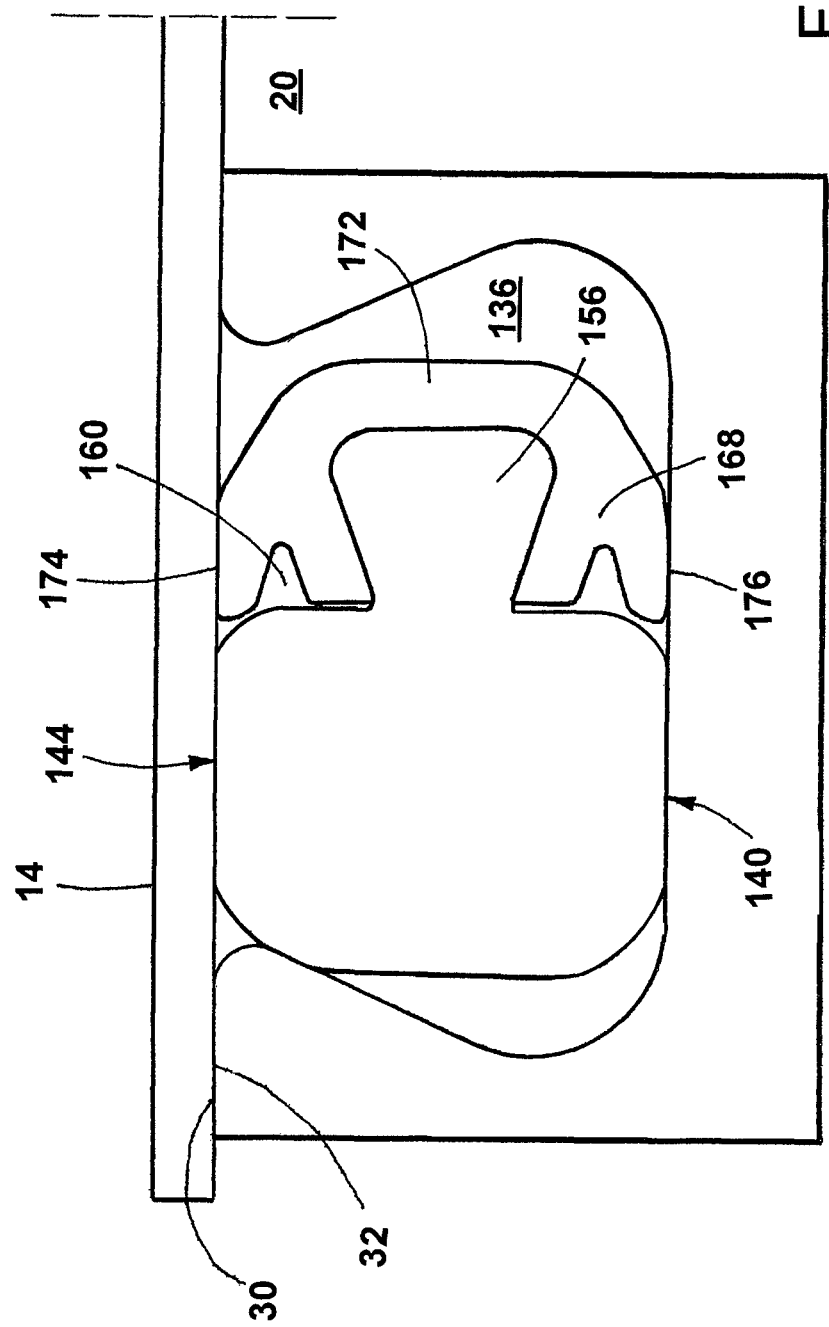
FIG. 6 is the seal of FIG. 5 in a deflected state.

Turning now to FIGS. 5 and 6, another exemplary seal 140 is situated in a groove 36, which in this embodiment also has a dovetail shape cross-section. The seal 140 has a generally ring-like shape, so as to be seated in the continuous groove 36. As will be appreciated, the seal 140 is shown in an undeflected state in FIG. 5, and in a deflected state in FIG. 6.

The seal 140 generally comprises a first seal element, in the form of an elastomeric seal element 144, and a second seal element, in the form of a polymeric seal element 148. The elastomeric seal element 144 has a deflectable portion 152 adapted to be deflected directly by the lid 114, as best seen in FIG. 6. A protrusion 156 extends radially from the deflectable portion 152 of the elastomeric seal 144 and is received in a recess 160 of the polymeric seal 148.

The polymeric seal element 148 includes an upper arm 164 and a lower arm 168 extending radially from a central body 172. The upper and lower arms 164 and 168 each have respective sealing surfaces 174 and 176. The upper and lower arms 164 and 168 and central axially extending body 172 together generally define the recess 160 in which the protrusion 156 of the elastomeric seal element 144 is received.

In the illustrated embodiment, the recess 160 has a generally dovetail shape cross-section, and the protrusion 156 has a corresponding shape when inserted therein. As will be appreciated, the protrusion 156 may have a shape and/or size corresponding to the shape of the recess 160 prior to insertion therein, or may be deflected such that it conforms to the shape of the recess 160 when inserted therein. Compression of the protrusion 156 within the recess 160 can result in a preload being applied to the upper and/or lower arms 164 and 168 to achieve a desired sealing load. Moreover, the protrusion 156 and recess 160 interlock to restrict separation of the elastomeric seal element 144 and the polymeric seal element 148. This interlock is created due to the axial extent of the opening of the recess being smaller than the axial extent of the protrusion at a point radially inside of the opening of the recess.

The interlocking fit between the elastomeric seal element 144 and the polymeric seal element 148 can also rotationally interlock the parts to restrict rotation of the elastomeric seal element 144 relative to the polymeric part 148 to prevent rotation of the seal 140 in the groove 136 during seal compression.

Similar to the seal 40 of FIGS. 2 and 3, the protrusion 156 has upper and lower inclined surfaces 180 and 182 that are generally radially coextensive with the sealing surfaces 174 and 176, respectively. The recess 160 has abutment surfaces 184 and 186 abutting the inclined surfaces 180 and 182 of the protrusion 156. Each sealing surface 174 and 176 and respective abutment surface 184 and 186 generally slope away from each other in the radially outward direction thereby forming wedging portions 188 and 190 of the second seal element 148 which assist in applying an axial sealing force to the sealing surfaces 174 and 176 upon compression of the first seal element 144, as previously described.

Turning to FIG. 6, when the lid 114 is converted to the sealed condition whereat it seals the access opening 122 into the processing space 120, the seal 140 is deflected as shown. As will be appreciated, during conversion to the sealed condition the lid 114 contacts the elastomeric seal element 144 prior to the polymeric seal element 148. As the elastomeric seal element 144 is deflected, the lid 114 eventually contacts the sealing surface 174 on the upper arm 168 and compresses the polymeric seal element 148. The sealing surface 176 on the lower arm seals against the bottom of the groove 136. The size (e.g., the radial extent) of the sealing surfaces can be altered to alter the sealing load.

As will be appreciated, when the seal 140 is deflected by the lid 114, the upper and lower arms 164 and 168 act on the protrusion 156 of the elastomeric seal element 144. A reactionary force is therefore applied by the protrusion 156 to energize sealing lips of the upper and lower arms 164 and 168 to thereby maintain a tight seal. Deflection of the arms 164 and 168 during compression can also contribute to a sealing force applied to the sealing surfaces.

The polymeric seal element 148 is supported by the elastomeric seal element 144, and the seal elements are adapted to seal in series. The elastomeric seal element 144 has a height, h1, that is larger than a height, h2, of the polymeric seal element 148, with the elastomeric seal element 144 extending above and below the height of the polymeric seal element 148 an approximately equal distance when in an undeflected state. The elastomeric seal element 144 and polymeric seal element 148 are generally symmetrical about a common central axis perpendicular to their respective heights, giving the seal 140 symmetry about the same axis. As will be appreciated, such symmetry enables the seal 140 to be reversible such that it can be installed in the groove 136 in either orientation. This feature eliminates the possibility of a seal being installed upside down, for example.

Figure 7:
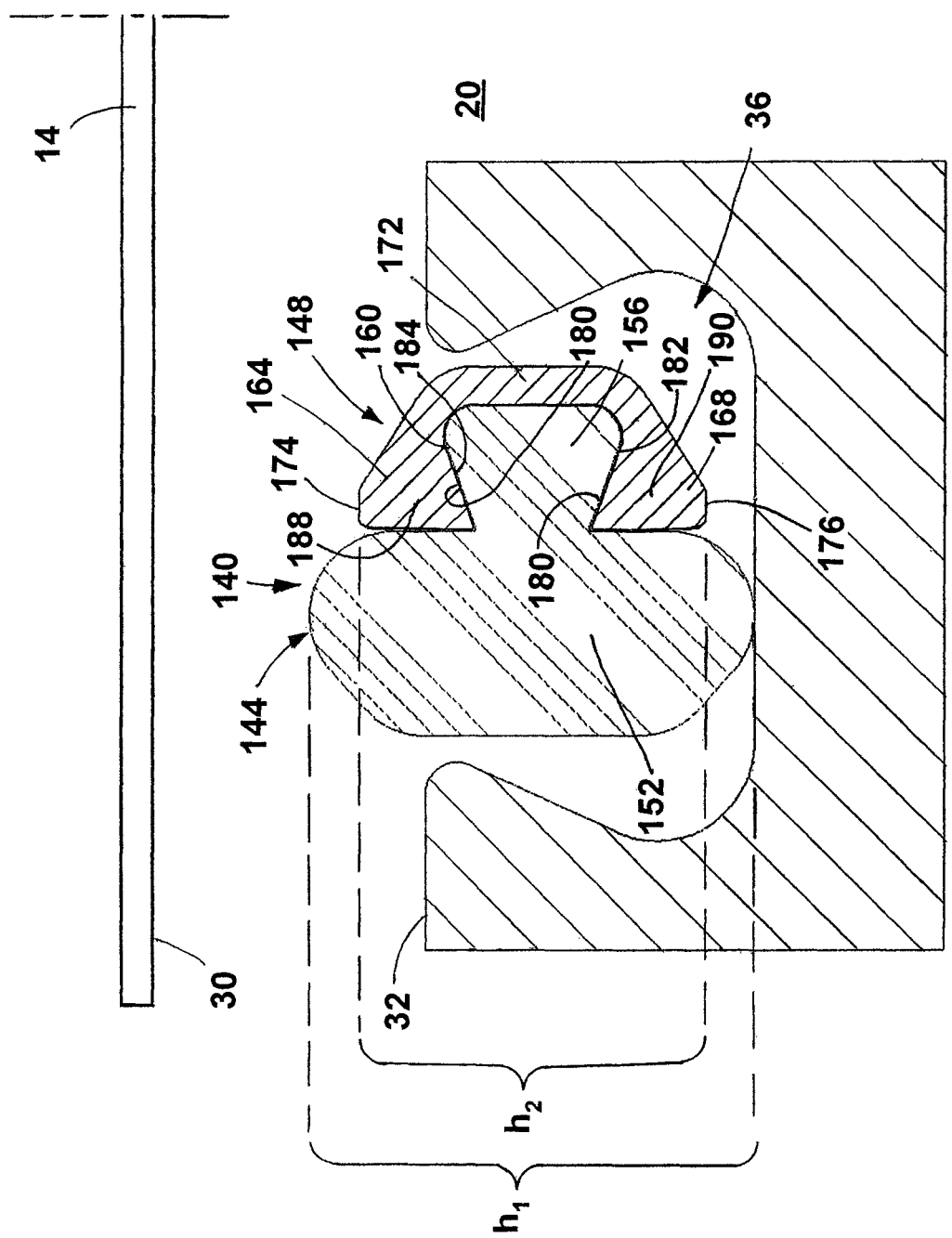
FIG. 7 is another exemplary seal in accordance with the invention.

In the illustrated embodiment, the polymeric seal element 148 has radially outwardly opening compression grooves 180 and 182 spaced axially above and below the recess 160. These grooves 180 and 182 define the upper and lower lip portions 174 and 176 of the polymeric seal element adapted to seal against respective surfaces. Such compression grooves 180 and 182 are optional and may be omitted in some applications. For example, FIG. 7 illustrates a seal 140 without compression grooves 180 and 182. Generally, the compression grooves 180 and 182 will decrease the sealing pressure applied by the protrusion 156 to the sealing surfaces 174 and 176 when the seal 140 is deflected, since the lips will have a reduced thickness in an axial dimension.

The elastomeric seal elements can be made from a wide variety of materials including Fluorocarbon (FKM, FPM), High Performance Fluoroelastomers (HiFluor), Perfluoroelastomers (FFKM, Elastomeric PTFE), Polyacrylate (ACM), Ethylene Acrylate (AEM), Isobutylene-Isoprene (IIR), Polychloroprene Rubber (CR), Ethylene Propylene Rubber (EPM, EPR, EPDM), Fluorosilicone (FVMQ), Acrylonitrile-Butadiene (NBR), Hydrogenated Nitrile (HNBR, HSN), Polyurethane (AU, EU), Silicone (VMQ, PVMQ), and Tetrafluoroethylene-Propylene (AFLAS registered trademark). The polymeric seal can be made from polymeric materials including Polyether Ether Ketone (PEEK), Polytetrafluoroethylene (PTFE), Polyamide (PA), Fluoropolymers (PFA), Polyetherimide (PEI aka Ultem), nylon, etc.

Although the first and second seal elements of seals have been described as an elastomeric seal element and a polymeric seal element, other materials can be used without departing from the scope of the invention. Further, the individual seal elements can be snapped together to form the seals. To this end, the wedge shape of the radially inner portion of the protrusion as seen in FIGS. 3 and 4 can assist in axially expanding the recess to allow the seal elements to snap together. In some instances, the seal elements can be bonded together to restrict separation thereof in addition to the mechanical interlock between the protrusion and recess.

Although the processing chamber, the seals, the elastomeric seal elements, the polymeric seal elements, and/or associated methods have been shown and described with respect to certain embodiments, it is obvious that equivalent alterations and modifications will occur to others skilled in the art. In regard to the various functions performed by the above described elements (e.g., components, assemblies, systems, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function. In addition, while a particular feature of the invention may have been described above with respect to only one or more of several illustrated embodiments, such feature may be combined with one or more other features of the other embodiments, as may be desired and advantageous for any given or particular application.

The invention claimed is:

1. A seal for sealing an interface between a container and a lid of a process chamber, the seal comprising:
   a first seal element having a deflectable portion and a protrusion extending radially inwardly from the deflectable portion; and
   a second seal element having at least one sealing surface and a radially outwardly extending recess in which the protrusion of the first seal element is received, a radially inner surface of the protrusion abutting a radially inner surface of the recess;
   wherein the protrusion and recess interlock to restrict separation of the first and second seal elements;
   wherein the protrusion has an inclined surface that is radially coextensive with a major portion of the sealing surface and extends to a maximum axial extent of the protrusion; and
   wherein the at least one sealing surface is configured to pivot about a point located radially inwardly and outside of the second seal member when the seal is deflected.

2. A seal as set forth in claim 1, wherein the second seal element has an abutment surface abutting the inclined surface of the protrusion, whereby during compression of the seal when a force is applied to the second sealing element tending to separate it from the first seal element, a reaction force is generated at the inclined surface that tends to apply an axial sealing force to the at least one sealing surface of the second sealing element.

3. A seal as set forth in claim 1, wherein the inclined surface extends to the radially outer extent of the protrusion.

4. A seal as set forth in claim 1, wherein the sealing surface and the abutment surface of the second seal element slope away from each other in the radially outward direction thereby forming a wedging portion of the second seal element for applying an axial sealing force to the sealing surface upon compression of the first seal element.

5. A seal as set forth in claim 1, wherein the inclined surface of the protrusion extends to a midpoint of the sealing surface.

6. A seal as set forth in claim 1, wherein the recess and/or protrusion have an anti-rotatable fit to restrict rotation of the first seal member relative to the second seal member.

7. A seal as set forth in claim 1, wherein the second seal member further comprises upper and lower arms extending radially from a central axially extending body, the arms and body defining therebetween the recess and being adapted to engage opposing sides of the protrusion.

8. A seal as set forth in claim 1, wherein the recess has a dovetail-shape cross-section.

9. A seal as set forth in claim 1, wherein the second seal element is supported by the first seal element, and wherein the first seal element and second seal element are adapted to seal in series.

10. A seal as set forth in claim 1, wherein the first seal element extends above and below the height of the second seal element an approximately equal distance when in an undeflected state.

11. A seal as set forth in claim 1, wherein the first and second seal elements are generally symmetrical about a common central radial axis.

12. A seal as set forth in claim 1, wherein the second seal element has radially outwardly opening compression grooves spaced axially above and below the recess, the grooves defining upper and lower lip portions of the second sealing element adapted to seal against respective surfaces.

13. A seal as set forth in claim 1, wherein the first seal element is composed of an elastomeric material.

14. A seal as set forth in claim 1, wherein the second seal element is composed of a polymeric material.

15. A seal as set forth in claim 14, wherein the polymeric material includes at least one of PEEK and PTFE.

16. A seal as set forth in claim 1, wherein the first seal element and second seal element are bonded together.

17. A process chamber comprising a container defining a processing space and an access opening into the processing space, a lid convertible between a sealed condition whereat it seals the access opening into the processing space, and a loading/unloading condition whereat the access opening is uncovered for insertion/withdrawal of a substrate, and a seal as set forth in claim 1 for sealing an interface between the container and the lid.

18. A seal for sealing an interface between a container and a lid of a process chamber, the seal comprising:
   a first seal element having a deflectable portion and a protrusion extending radially from the deflectable portion; and
   a second seal element having at least one sealing surface and a radially extending recess in which the protrusion of the first seal element is received;
   wherein the protrusion and recess interlock to restrict separation of the first and second seal elements; and
   wherein the protrusion has an inclined surface that is radially coextensive with a major portion of the sealing surface and extends to a maximum axial extent of the protrusion, such maximum axial extent being generally radially aligned with a midpoint of the sealing surface.

19. A seal for sealing an interface between a container and a lid of a process chamber, the seal comprising:
   a first seal element having a deflectable portion and a protrusion extending radially from the deflectable portion; and
   a second seal element having at least two sealing surfaces and a radially extending recess in which the protrusion of the first seal element is received;
   wherein the protrusion and recess interlock to restrict separation of the first and second seal elements;
   wherein the protrusion has an inclined surface that is radially coextensive with a major portion of the sealing surface and extends to a maximum axial extent of the protrusion; and
   wherein the second seal member further comprises upper and lower arms each having a respective locking portion abutting the protrusion and a respective sealing end having one of the at least two sealing surfaces, the sealing ends spaced from the first seal element.

20. A seal as set forth in claim 19, wherein the second seal element has an abutment surface abutting the inclined surface of the protrusion, whereby during compression of the seal when a force is applied to the second sealing element tending to separate it from the first seal element, a reaction force is generated at the inclined surface that tends to apply an axial sealing force to the at least one sealing surface of the second sealing element.

* * * * *